July 7, 1964 J. E. OLBRYCH ETAL 3,140,447
INPUT SIGNAL CONTROLLED REGENERATIVE FREQUENCY DIVIDERS
Filed Jan. 18, 1961 3 Sheets-Sheet 1

INVENTORS:
JOHN E. OLBRYCH
SHOLLY KAGAN
BY
Arthur L. Bowers
AGENT

INPUT SIGNAL CONTROLLED REGENERATIVE FREQUENCY DIVIDERS

Filed Jan. 18, 1961 3 Sheets-Sheet 2

INVENTORS:
JOHN E. OLBRYCH
SHOLLY KAGAN
BY
Arthur L. Bowers
AGENT:

July 7, 1964 J. E. OLBRYCH ETAL 3,140,447

INPUT SIGNAL CONTROLLED REGENERATIVE FREQUENCY DIVIDERS

Filed Jan. 18, 1961 3 Sheets-Sheet 3

INVENTORS:
JOHN E. OLBRYCH
SHOLLY KAGAN

BY Arthur L. Bowers
AGENT

United States Patent Office 3,140,447

Patented July 7, 1964

3,140,447

INPUT SIGNAL CONTROLLED REGENERATIVE FREQUENCY DIVIDERS

John E. Olbrych, Salem, and Sholly Kagan, Natick, Mass., assignors, by mesne assignments, to the United States of America as represented by the Secretary of the Navy Filed Jan. 18, 1961, Ser. No. 83,600

2 Claims. (Cl. 328—15)

This invention relates to improvements in regenerative frequency dividers.

An object of this invention is to provide a frequency divider that is stable, operates jitter free, has substantially no phase shift, is more compact, has fewer parts, is inherently fail-safe, and requires less power than frequency dividers available heretofore and is generally more rugged, more practical, more efficient, easier to fabricate and more reliable.

A further object is to provide an improved frequency divider as above for a portable pack communication equipment and which is capable of withstanding a substantial range of environmental conditions.

A further object is to provide a regenerative frequency divider for dividing a frequency *nf* down to frequency *f* where *n* is an integer, that is non regenerative and non oscillatory until a predetermined input signal is applied thereto, and is regenerative for the duration of the signal and ceases to be regenerative and oscillating when the input signal is terminated.

A further object is to provide a frequency divider circuit for converting frequency *nf* to frequency *f* and that is degenerative, gain less than one, prior to the application of a predetermined input signal *nf* and regenerative, gain greater than one, when the predetermined input signal *nf* is applied in order that the frequency divider be non oscillatory when a proper signal is not applied and regenerative when a proper signal is applied.

Figure 1A:
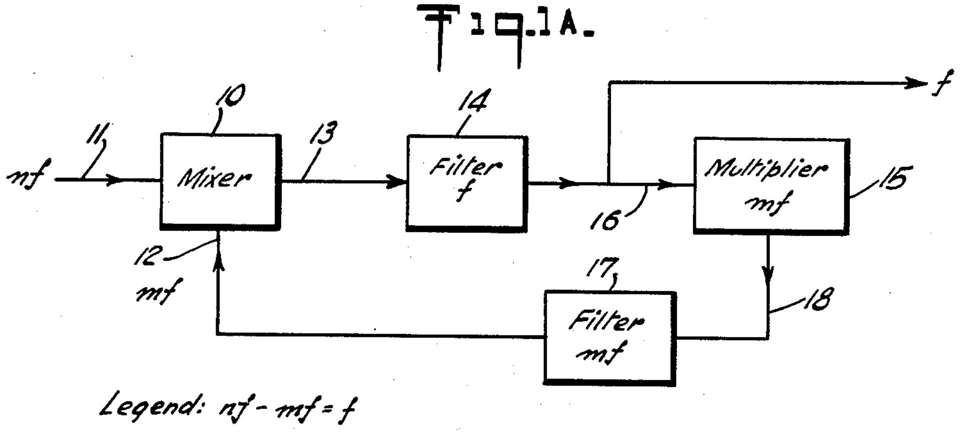
Figure 1B:
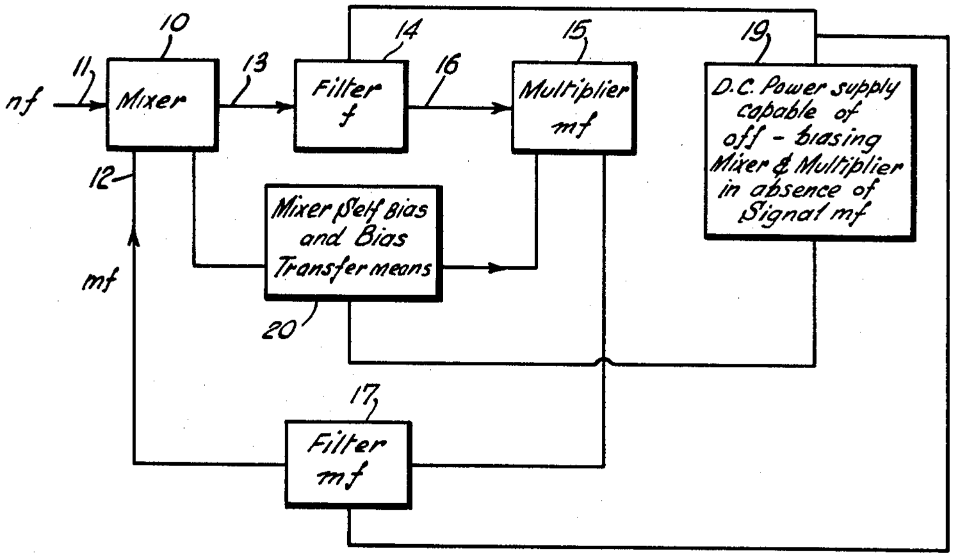
Figure 2:
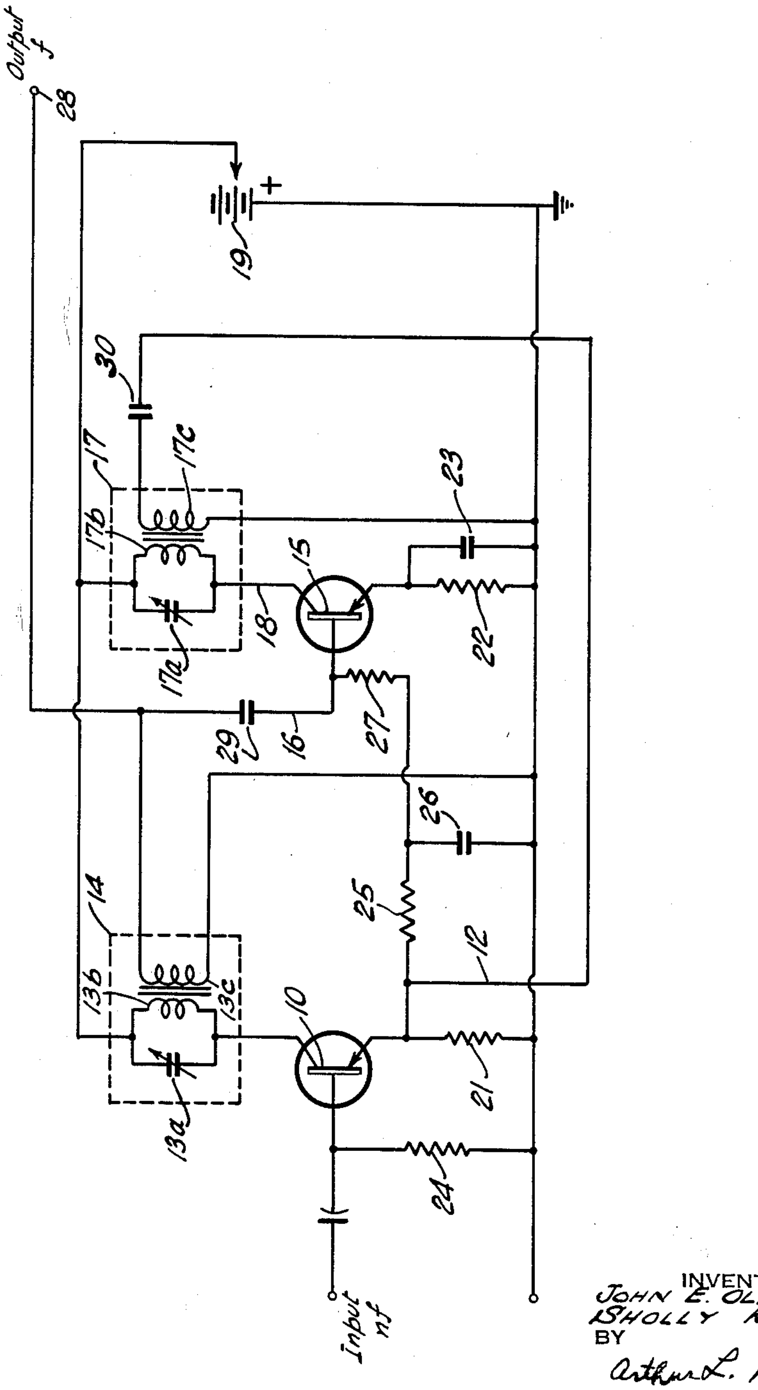
Figure 3:
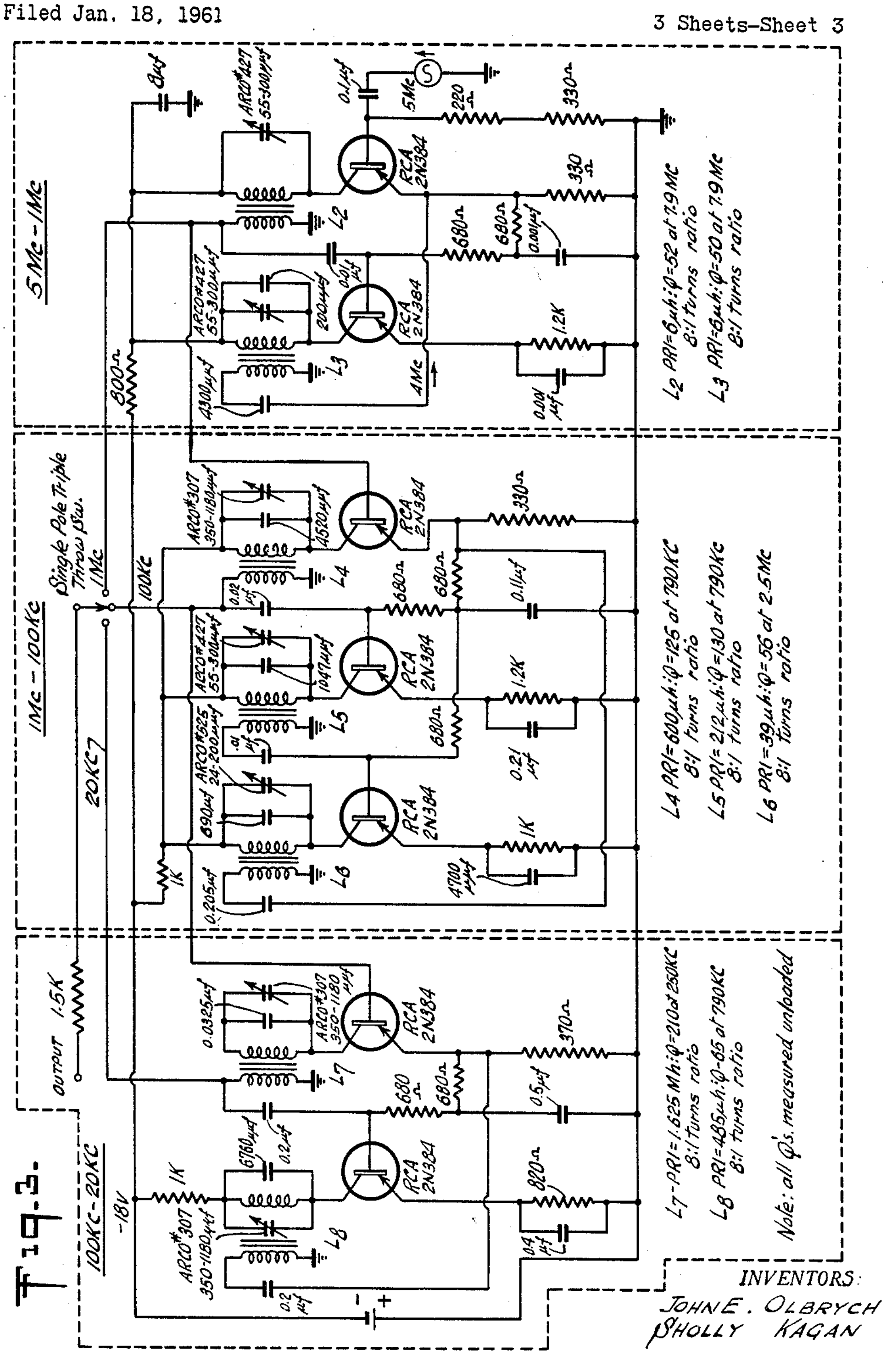

Other objects and many of the attendant advantages of this invention will be readily appreciated as the same becomes better understood by reference to the following detailed description when considered in connection with the accompanying drawing wherein:

FIGS. 1A and 1B are block diagrams illustrating the invention in its broader aspects, FIG. 2 is a schematic circuit diagram of a specific embodiment of the invention, and FIG. 3 is a plural stage frequency divider incorporating circuits as in FIG. 2.

FIGS. 1A and 1B illustrate the basic components and functions of a frequency divider circuit in accordance with this invention. The circuit includes a mixer input stage 10 having two input leads 11 and 12 and an output lead 13. A narrow band pass filter 14 tuned to frequency *f* is connected to the output lead 13 of the mixer. A frequency multiplier stage 15 is connected to the output 16 of the filter 14 for converting energy of frequency *f* from the filter 14 to energy of frequency *mf*, where *m* is an integer, and a narrow band pass filter 17 tuned to frequency *mf* is connected to the output 18 of the frequency multiplier for transferring energy of frequency *mf* through to input 12 of the mixer. In FIG. 1B there is shown certain salient features of the invention namely, direct current power supply 19 and mixer self bias and bias transfer means 20 where the power supply is capable of off-biasing the mixer and multiplier in the absence of signal *nf* and where the bias means 20 transfers the potential from the mixer self bias to the multiplier 15 to on bias the multiplier after the self bias of mixer 10 reaches a predetermined level.

In the circuit embodiment shown in FIG. 2, corresponding parts are designated by the same reference characters as in FIG. 1. The mixer 10 and multiplier 15 are PNP transistors. Not only are transistors advantageous in this invention because of their small size and low power consumption but in addition, they are much simpler to use as mixers and multipliers than are vacuum tubes. Their transconductances are much higher; the conversion transconductance, which is the ratio of the mixed output current to mixing input voltage, is much higher in transistors than in vacuum tubes enabling the use of fewer components to achieve good results.

The filters 14 and 17 are high Q tuned circuits each including a tank circuit having parallel-connected condenser *a* and inductance coil *b*, and an output coil *c* inductively coupled to coil *b*. The tank circuits are connected in series with the collectors of the respective transistors. High Q coils are included in the tuned circuits, not only to achieve narrow band-passes, but more importantly, for obtaining high impedance in the tank circuits for maximum gain in the mixer and multiplier stages. The negative terminal of a suitable direct current power supply is connected to each of the tuned circuits 14 and 17. Bias resistors 21 and 22 are connected between the emitters of transistors 10 and 15 respectively and the positive terminal of the power supply 20 which also is the electrical common or ground for the circuit. A bypass condenser 23 is connected in shunt across resistor 22. An input resistor 24 is connected between the base of transistor 10 and ground. The power supply voltage is selected to off-bias both transistors; in the absence of an input signal there is no current flow through the transistors. When a sinusoidal input signal of sufficient amplitude is applied to the input circuit of transistor 10, emitter current flows during that portion of each negative half cycle of the input signal that overcomes the off-bias. Initially during the first cycles of an applied signal, and while emitter current flows, the emitter voltage changes in a negative direction with increasing emitter current and changes in a positive direction with decreasing emitter current flow through the bias resistor 21. A resistor 25 and a condenser 26 are connected across the bias resistor 21. The condenser 26 is charged negatively when emitter current flows in transistor 10. A resistor 27 is connected between the base of transistor 15 and the connection between resistor 25 and condenser 26 so that the base of transistor 15 follows the voltage on the condenser 26. The resistors 25 and 27 function as isolating resistors preventing loading of the transistors 10 and 15 by condenser 26.

One end of coupling coil 13*c* of filter 14 is connected to the circuit output terminal 28. A condenser 29 selected to be resonant with coupling coil 13*c* at the tuned frequency *f* of filter 14 is conected between said one end of coupling coil 13*c* and the base of transistor 15. A condenser 30 selected to be resonant with the coupling coil 17*c* at the tuned frequency *mf* of filter 17 is connected between one end of coupling coil 17*c* and the emitter of transistor 10. The other ends of the coupling coils 13*c* and 17*c* are connected to ground. Energy from coupling coil 13*c* is substantially blocked from the emitter of transistor 10 and energy from coupling coil 17*c* is substantially blocked from the base of transistor 15 by the isolation afforded by the resistors 25 and 27 and the condenser 26.

When there is no input signal *nf*, the potential of the power supply 19 is selected to be high enough so that when there is no input signal applied between base and collector of both transistors, no current flows through the base-collector circuit. There is no current flow in the emitter-base circuit because there is no difference in potential. When an input signal *nf* of sufficient amplitude is applied, it is postulated that the following sequence of events occurs. During the peak portion of the first negative half cycle, the transistor 10 is on-biased. A pulse of emitter current flows from power supply 19 through the two legs of a parallel circuit including resistor 21 as one leg and resistor 25 and condenser 26 as the other leg. The resistor 25 and condenser 26 comprise a comparatively long time constant circuit compared to the period of the input signal so that the condenser 26 charges to a small fraction of the pulse voltage. In the interval between the negative peak portions of the first cycle and the second cycle of the input signal, the discharge path seen by condenser 26 is the resistor 25 in series with resistor 21 which is a higher impedance path than the charge path. Therefore, the condenser retains substantially all of its charge in the intervals between emitter current pulses. During successive cycles of the input signal, the condenser 26 charges progressively toward a level where it on-biases the transistor 15, provided the input signal *nf* is of sufficient amplitude.

The pulse of collector current that flows through the filter 14 during the on-biased portion of the first cycle of the input signal develops very little voltage in the coupling coil 13*c*, not near enough to on-bias transistor 15 since circuit 14 is a high Q circuit and since the frequency *nf* is substantially removed from the tuned frequency *f* of the circuit 14. During successive cycles of the input signal *nf* the voltage developed in the coupling coil continues to have no effect on the transistor 15 until the latter is on biased by the potential on condenser 26 as described above. At that time, any weak pulse energy coupled by the coil 13*c* and condenser 29 into the base of transistor 15 is amplified by the multiplier. It causes a pulse of collector current to flow through the tank circuit 17*a*, 17*b*. Because the tuned frequency of circuit 17 is not as far removed from frequency *nf*, the coupling coil 17*c* and condenser 30 delivers a substantially amplified pulse to the emitter of transistor 10. A difference between the waveform of the input signal *nf* and the pulse delivered to the emitter enables the mixer to produce a pulse of collector current having a frequency component less than *nf* and closer to the tuned frequency of circuit 14. This component though of low amplitude is coupled to the multiplier 15. The subsequent pulse of collector current through circuit 17 includes a frequency component *mf* to which the circuit 17 is tuned. During successive input cycles of the input signal, the frequency components to which the stages are tuned are favored and when the gain of the second transistor rises sufficiently, the entire circuit becomes regenerative. The frequency divided signal *f* is obtained at the output terminal 28.

Because the input transistor 10 and the other transistor 15 are initially off-biased, the system is incapable of self oscillation and is insensitive to noise impulses. Noise impulses do not charge condenser 26 sufficiently to on-bias the transistor 15. With the application of a signal, the base to emitter diode of the first transistor 10 conducts on the negative portion of the input signal thereby charging condenser 26 and providing on-bias for the second transistor via the resistor 27.

FIG. 3 is a schematic circuit diagram of a three-stage frequency divider, each stage being similar to the one shown in FIG. 2 for dividing 5 megacycles to 1 megacycle, 100 kilocycles, and 20 kilocycles. The values for the circuit elements are included in the drawing.

Obviously many modifications and variations of the present invention are possible in the light of the above teachings. It is therefore to be understood that within the scope of the appended claims the invention may be practiced otherwise than as specifically described.

We claim:

1. An improved frequency divider for generating sinusoidal electrical energy of frequency *f* in response to electrical energy containing frequency *nf* where *n* is an integer, and which divider is non-oscillatory in the absence of an input signal *nf* within a predetermined range of amplitude and that is regenerative when an input signal *nf* within said predetermined range of amplitude is applied thereto comprising a PNP transistor for mixing and a PNP transistor for frequency multiplication, a direct current power supply, a bias resistor connected between the emitter of said mixer transistor and the positive terminal of said power supply, an input resistor connected between the base of said mixer transistor and the positive terminal of said power supply, a bias resistor shunted by a bypass condenser connected between the emitter of said frequency multiplier transistor and said positive terminal of said power supply, means connected to the emitter circuit of said mixer transistor and the base circuit of said frequency multiplier transistor for maintaining said base at the potential of said emitter and for substantially blocking transfer of oscillatory energy between said mixer emitter and said multiplier base, a high Q circuit tunable to frequency *f* connected between the collector of said mixer and a selected negative terminal voltage of said power supply and including means for coupling out of said high Q tuned circuit sinusoidal energy of frequency *f*, means for coupling energy of frequency *f* from said tuned circuit into the base of said frequency multiplier, a second high Q circuit tunable to frequency *mf* connected between the collector of said frequency multiplier and said selected negative terminal voltage of said power supply, where *m* is an integer and $n-m=1$, said second high Q tunable circuit including means for coupling out sinusoidal energy of frequency *mf*, and means for coupling energy of frequency *mf* from said high Q tuned circuit into the emitter of said mixer, whereby in the absence of an input signal said transistors are off biased and when a sinusoidal input signal of frequency *nf* within said predetermined range of amplitude is coupled into the base of said mixer said frequency divider is rendered operable and regenerative in the frequency division mode.

2. An improved frequency divider for generating sinusoidal electrical energy of frequency *f* in response to electrical energy containing frequency *nf* where *n* is an integer and which divider is non oscillatory in the absence of an input signal *nf* within a predetermined range of amplitude and that is regenerative when an input signal *nf* within said predetermined range of amplitude is applied thereto comprising mixing means for mixing frequency *nf* with frequency *mf*, where $n-m=1$, and producing an output frequency *f*, frequency multiplier means for converting frequency *f* to frequency *mf*, means for coupling energy of frequency *mf* from said multiplier to said mixer, means for coupling energy of frequency *f* from said mixer to said multiplier and to an output terminal of said frequency divider, direct current power supply means for off-biasing said mixer and multiplier in absence of input signal *nf* of sufficient amplitude and for permitting on-bias of said mixer only when an input signal *nf* of sufficient amplitude is applied thereto, and bias transfer means connected between said mixer and said multiplier for on-biasing said multiplier a predetermined length of time after said mixer is on-biased by an input signal *nf* of sufficient amplitude.

References Cited in the file of this patent

UNITED STATES PATENTS

| | | |
|---|---|---|
| 2,541,378 | Nyquist | Feb .13, 1951 |
| 2,544,922 | Greenough | Mar. 13, 1951 |
| 2,926,244 | Stryker | Feb. 23, 1960 |
| 3,007,117 | Cutler | Oct. 31, 1961 |